(12) United States Patent
Kiang et al.

(10) Patent No.: US 8,603,312 B2
(45) Date of Patent: Dec. 10, 2013

(54) PARTICLE TRANSPORTER

(75) Inventors: Jean-Fu Kiang, Taipei (TW); Tsung-Chi Kuo, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 71 days.

(21) Appl. No.: 13/104,016

(22) Filed: May 9, 2011

(65) Prior Publication Data

US 2012/0234680 A1 Sep. 20, 2012

(30) Foreign Application Priority Data

Mar. 18, 2011 (TW) .............................. 100109384 A

(51) Int. Cl.
*G01N 27/26* (2006.01)
*C25B 9/00* (2006.01)

(52) U.S. Cl.
USPC ........................... 204/450; 204/600; 422/68.1

(58) Field of Classification Search
USPC ................... 204/450, 600; 422/68.1
See application file for complete search history.

(56) References Cited

U.S. PATENT DOCUMENTS

| | | | |
|---|---|---|---|
| 7,029,564 B1 | 4/2006 | Lock et al. | |
| 2003/0202256 A1* | 10/2003 | Bao et al. | 359/665 |
| 2005/0211557 A1* | 9/2005 | Childers et al. | 204/547 |
| 2008/0135411 A1* | 6/2008 | Whitehead et al. | 204/547 |
| 2009/0218223 A1* | 9/2009 | Manaresi et al. | 204/547 |
| 2010/0320088 A1* | 12/2010 | Fouillet et al. | 204/454 |

FOREIGN PATENT DOCUMENTS

| | | |
|---|---|---|
| TW | 201024732 | 7/2010 |
| WO | WO 2009/052123 A2 * | 4/2009 |

OTHER PUBLICATIONS

Morganti (AC electrokinetic analysis of chemically modified microparticles, THESIS).*
"Office Action of Taiwan Counterpart Application", issued on May 24, 2013, p. 1-p. 4.

* cited by examiner

*Primary Examiner* — J. Christopher Ball
*Assistant Examiner* — Jennifer Dieterle
(74) *Attorney, Agent, or Firm* — Jianq Chyun IP Office

(57) ABSTRACT

A particle transporter based on travelling-wave dielectrophoresis is provided. The particle transporter includes a plurality of turn-around electrodes. The turn-around electrodes are disposed on a substrate and arranged in a fan shape. The turn-around electrodes provide an arc channel for transporting a plurality of particles. Wherein, the turn-around electrodes are not connected to each other, and neighboring sides of any two adjacent electrodes of the turn-around electrodes are approximately parallel.

24 Claims, 5 Drawing Sheets

PARTICLE TRANSPORTER

CROSS-REFERENCE TO RELATED APPLICATION

This application claims the priority benefit of Taiwan application serial no. 100109384, filed Mar. 18, 2011. The entirety of the above-mentioned patent application is hereby incorporated by reference herein and made a part of this specification.

BACKGROUND

1. Technical Field

The disclosure relates to a micro device or a micro electromechanical device. Particularly, the disclosure relates to a particle transporter.

2. Related Art

In chemical reactions, biochemical reactions (for example, cell separation and integration) and enzymatic reactions, etc., particles in the reaction are generally required to be moved. A particle transporter can be implemented to move the particles. According to a conventional technique, a fluid driving module is generally used to drive fluid (for example, water) in the particle transporter to flow, and drive the particles in the fluid to move along with flowing of the fluid. During the moving process, since the fluid driven by the fluid driving module is maintained in a fixed flow direction, the conventional technique cannot arbitrarily change the flow direction of the particles or fix positions of the particles, i.e. cannot make the particles to move upstream. On the other hand, according to the conventional technique, the additional fluid driving module and related fluid pipes are required, which lead to extra cost.

SUMMARY

An embodiment of the disclosure provides a particle transporter including a plurality of turn-around electrodes. The turn-around electrodes are disposed on a substrate and are arranged in a fan shape to provide an arc channel for transporting a plurality of particles. Where, the turn-around electrodes are not connected to each other, and neighbouring sides of any two adjacent turn-around electrodes in the turn-around electrodes are approximately parallel.

An embodiment of the disclosure provides a particle transporter including a common electrode disposed on a substrate, a plurality of left switch electrodes and a plurality of right switch electrodes. The left switch electrodes and the right switch electrodes are respectively disposed adjacent to different ends at one side of the common electrode. The left switch electrodes are disposed on the substrate along a first straight-line direction. The left switch electrodes are parallel to the common electrode and provide a left switch channel to transport a plurality of particles. The right switch electrodes are disposed on the substrate along a second straight-line direction. The right switch electrodes are parallel to the common electrode and provide a right switch channel to transport the particles. Where, a common end of the left switch channel and the right switch channel is formed at the common electrode.

An embodiment of the disclosure provides a particle transporter including a first collection electrode and a second collection electrode on a substrate. The first collection electrode has a first dentate portion. The second collection electrode is located adjacent to the first dentate portion of the first collection electrode. The second collection electrode has a second dentate portion at a side adjacent to the first dentate portion. Where, a particle collection space is formed around tips of the first dentate portion and the second dentate portion.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Particles suspended in an electric field may exhibit an electrophoresis phenomenon due to influence of various forces. A low-frequency electric field EF may exert a Coulomb force to charged particles 110 to cause the electrophoresis phenomenon. The aforementioned particles include biomedical cells, bacteria, virus or other organic/inorganic particles. An interaction between the particles and a non-uniform field may cause a dielectrophoresis (DEP) phenomenon, an electrorotation phenomenon or a travelling-wave dielectrophoresis (twDEP) phenomenon, etc. These phenomena can be used to non-destructively manipulate positions of the particles and move the particles.

The disclosure is directed to a particle transporter, which uses a dielectrophoresis (DEP) force and a travelling-wave dielectrophoresis (twDEP) force to move/transport particles.

Figure 1A:
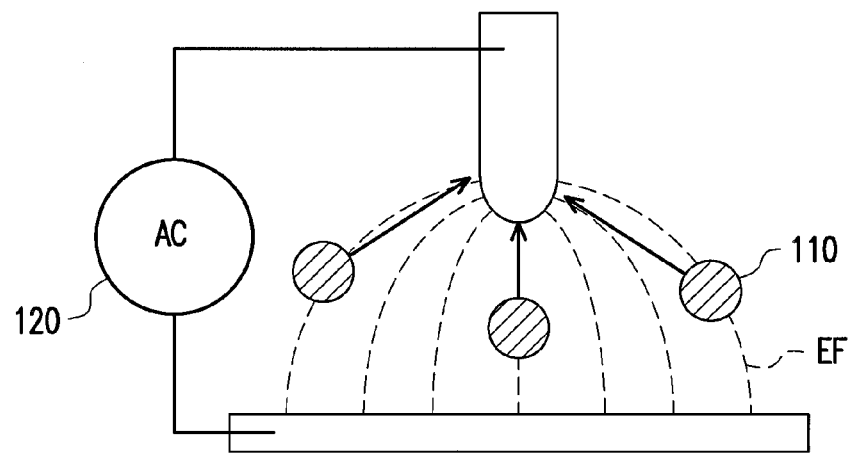
FIG. 1A and FIG. 1B are schematic diagrams illustrating a dielectrophoresis (DEP) phenomenon of particles in an electric field.
Figure 1B:
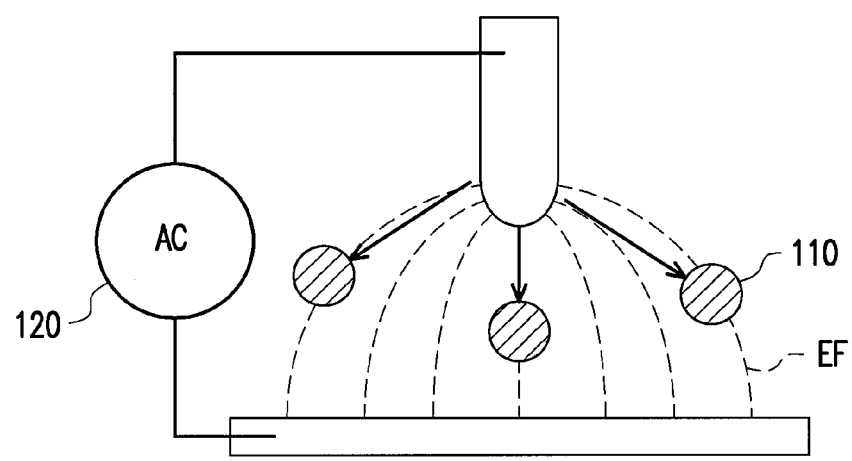

FIG. 1A and FIG. 1B are schematic diagrams illustrating the DEP phenomenon of the particles 110 in the electric field EF. A power supply unit provides a power signal to each electrode. For example, an alternating current (AC) power supply 120 provides an AC voltage to two electrodes to produce the AC electric field EF between the two electrodes. The low-frequency AC electric field EF induces frequency related dipole moment to the polarizable particles 110 and surrounding fluid. Since the electric field EF is non-uniform, the Coulomb forces exerted to two ends of the particle 110 are different. Therefore, the particle 110 is attracted towards a direction with a stronger Coulomb force. In FIG. 1A, when the polarization strength of the particles 110 is greater than that of the surrounding fluid, the electric field EF have a positive DEP effect on the particles 110, and the particles 110 are attracted towards a region with a stronger electric field EF (moved towards directions shown by arrows). In FIG. 1B, when the polarization strength of the particles 110 is smaller than that of the surrounding fluid, the electric field EF have a negative DEP effect on the particles 110, and the particles 110 are moved towards a region with a weaker electric field EF (moved towards directions shown by arrows).

Figure 2:
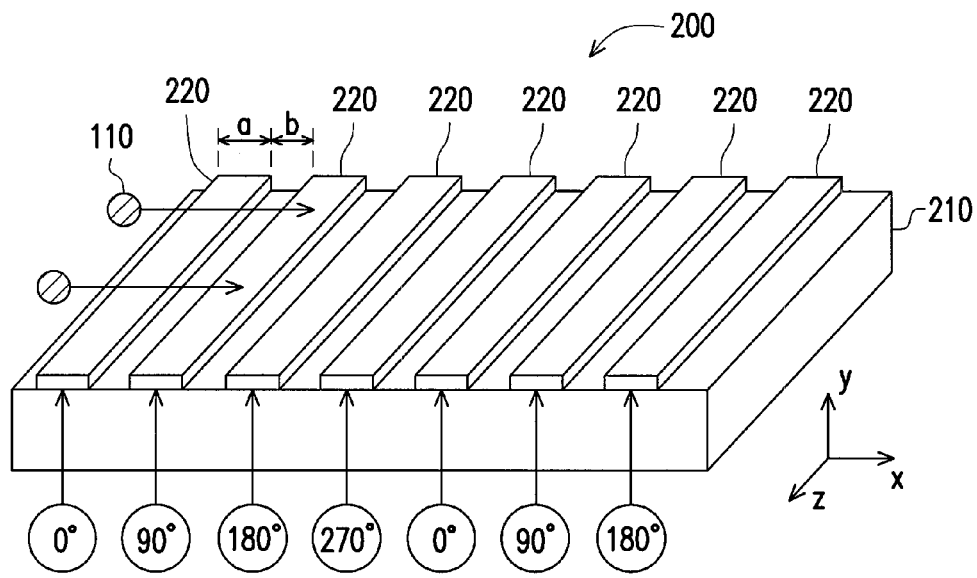
FIG. 2 is a schematic diagram illustrating a twDEP phenomenon of the particles in the electric field.

FIG. 2 is a schematic diagram illustrating the twDEP phenomenon of the particles 110 in the electric field EF. A substrate 210 is made of a flexible/rigid non-conductive material, which is for example, a printed circuit board (PCB), etc. A plurality of transport electrodes 220 are disposed on the substrate 210 along a straight-line direction (for example, an X-axis direction shown in FIG. 2). The transport electrodes 220 form a conveyer 200. The transport electrodes 220 respectively have a rectangular shape, and are parallel to each other as that shown in FIG. 2. Those skilled in the art can adjust/determine a width a of the transport electrode 220 and a space b between two adjacent electrodes according to a characteristic of the particles 110 and a characteristic of the surrounding fluid. In the present exemplary embodiment, $0.5a < b < 1.5a$, and for example, $a=b$.

These transport electrodes 220 are respectively provided with a set of AC signals, and the AC signals of any two adjacent electrodes of the transport electrodes 220 have a phase difference, which is, for example, 90°. For example, in FIG. 2, if the AC signal provided to a first transport electrode 220 at the left side has a phase of 0°, the AC signal of a second transport electrode 220 then has a phase of 90°, the AC signal of a third transport electrode 220 has a phase of 180°, and the AC signal of a fourth transport electrode 220 has a phase of 270°. Deduced by analogy, the AC signals of a fifth to a seventh transport electrodes 220 respectively have phases of 0°, 90°, and 180°. Therefore, these transport electrodes 220 provide an electric field having a travelling wave (with a direction from the left to the right). The particles 110 are moved along the travelling wave direction under a travelling-wave dielectrophoresis (twDEP) force, which enables these transport electrodes 220 to provide a straight-line channel to transport the particles 110.

Lengths of the transport electrodes 220 are approximately the same. Those skilled in the art can configure the lengths of the transport electrodes 220 to be unequal according to an actual design requirement, for example, the lengths of the transport electrodes 220 of FIG. 2 are sequentially decreased from the left to the right (along the X-axis direction). Since the straight-line channel provided by these transport electrodes 220 is narrowed from the left to the right (along the X-axis direction), by moving the particles from the left to the right, a particle collecting effect is also achieved.

Figure 3:
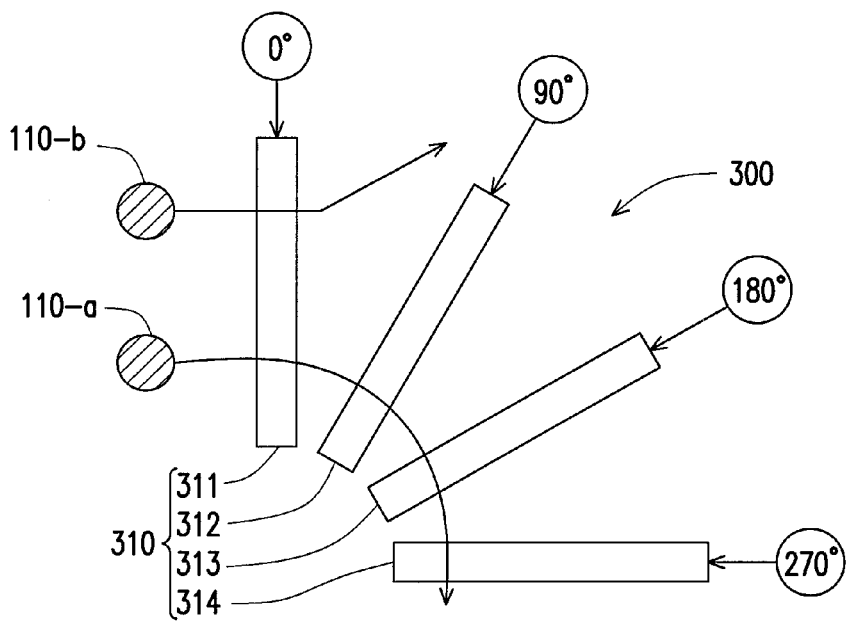
FIG. 3 is a top view of a layout of a particle transporter.

FIG. 3 is a top view of a layout of a particle transporter. The particle transporter includes a plurality of turn-around electrodes 310, for example, turn-around electrodes 311, 312, 313 and 314 respectively having a rectangular shape shown in FIG. 3. These turn-around electrodes 311, 312, 313 and 314 form a turn-around 300. The turn-around electrodes 311, 312, 313 and 314 are disposed on a substrate in a fan shape, and the turn-around electrodes 311, 312, 313 and 314 are not connected to each other, as that shown in FIG. 3.

A power supply unit provides power signals to the turn-around electrodes 310 of the particle transporter. For example, these turn-around electrodes 310 are respectively provided with a set of AC signals, and the AC signals of any two adjacent electrodes in the turn-around electrodes 310 have a phase difference, which is, for example, 90°. For example, in FIG. 3, if the AC signal provided to the first turn-around electrode 311 at the left side has a phase of 0°, the AC signal of the second turn-around electrode 312 then has a phase of 90°, the AC signal of the third turn-around electrode 313 has a phase of 180°, and the AC signal of the fourth turn-around electrode 314 has a phase of 270°. Therefore, these turn-around electrodes 310 provide an arc channel for transporting the particles 110. For example, a particle 110-$a$ is moved along the arc channel under a function of the twDEP force (moved along a direction shown by an arrow). However, since the space between the electrodes at an outer side is excessively large, the electric field at the outer ring of the arc channel is excessively weak, and the particles 110 (for example, a particle 110-$b$) close to the outer ring of the arc channel can probably escape due to the weak twDEP force.

Figure 4:
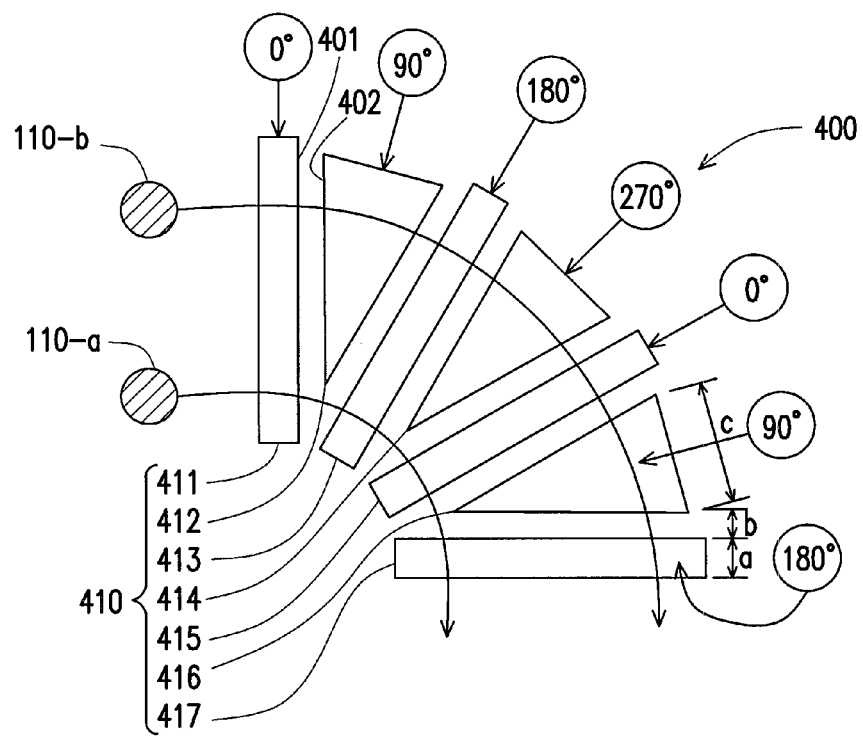
FIG. 4 is a top view of a layout of a particle transporter according to a first exemplary embodiment of the disclosure.

FIG. 4 is a top view of a layout of a particle transporter according to a first exemplary embodiment of the disclosure. The related descriptions of FIG. 3 can be referred for descriptions of the present exemplary embodiment. The particle transporter includes a plurality of turn-around electrodes 410, for example, turn-around electrodes 411, 412, 413, 414, 415, 416 and 417. These turn-around electrodes 410 form a turn-around 400. The turn-around electrodes 410 are disposed on a substrate in a fan shape, and are not connected to each other, and neighbouring sides of any two adjacent electrodes of the turn-around electrodes 410 are approximately parallel. For example, a neighbouring side 401 of the turn-around electrode 411 is approximately parallel to a neighbouring side 402 of the turn-around electrode 412. In the present exemplary embodiment, the turn-around electrodes 411, 413, 415 and 417 respectively have a rectangular shape. These rectangular electrodes are arranged on the substrate in a fan shape. The turn-around electrodes 412, 414 and 416 respectively have a triangular shape (or a fan shape). Theses triangular shape (or fan shape) electrodes are disposed between the turn-around electrodes 411, 413, 415 and 417, as shown in FIG. 4. Therefore, the neighbouring sides of the rectangular electrodes and the triangular (or fan shape) electrodes can be mutually parallel.

Those skilled in the art can adjust/determine a width of each of the turn-around electrodes 410 and a space between two adjacent electrodes according to a characteristic of the particles 110 and a characteristic of the surrounding fluid. For example, if the width of the rectangular electrode is a, the space between the rectangular electrode and the triangular electrode is b, and a length of a side opposite to an acute angle of the triangular electrode is c, then $0.5a < b < 1.5a$, and $c \leq 2a$.

Theses turn-around electrodes 410 are respectively provided with a set of AC signals, and the AC signals of any two adjacent electrodes of the turn-around electrodes 410 have a phase difference, which is, for example, 90°. For example, in FIG. 4, if the AC signal provided to the first turn-around electrode 411 has a phase of 0°, the AC signal of the second turn-around electrode 412 then has a phase of 90°, the AC signal of the third turn-around electrode 413 has a phase of 180°, and the AC signal of the fourth turn-around electrode 414 has a phase of 270°. Deduced by analogy, the AC signals of the fifth to the seventh turn-around electrodes 415-417 respectively have phases of 0°, 90°, and 180°. Therefore, these turn-around electrodes 410 provide an arc channel for transporting the particles 110. For example, a particle 110-$a$ is moved along an inner ring of the arc channel under a function of the twDEP force (moved along a direction shown by an arrow), and a particle 110-$b$ is moved along an outer ring of the arc channel under the function of the twDEP force (moved along a direction shown by an arrow). Design of the turn-around electrodes 412, 414 and 416 mitigates the problem of excessively large space between the electrodes at the outer ring of the arc channel, so that the particles 110 at any positions in the arc channel formed by theses turn-around electrodes can be smoothly turned around without escaping.

The conveyer 200 of FIG. 2 and the turn-around 400 can be arbitrarily combined according to an actual design requirement, so as to determine/define a moving path of the particles 110.

Figure 5:
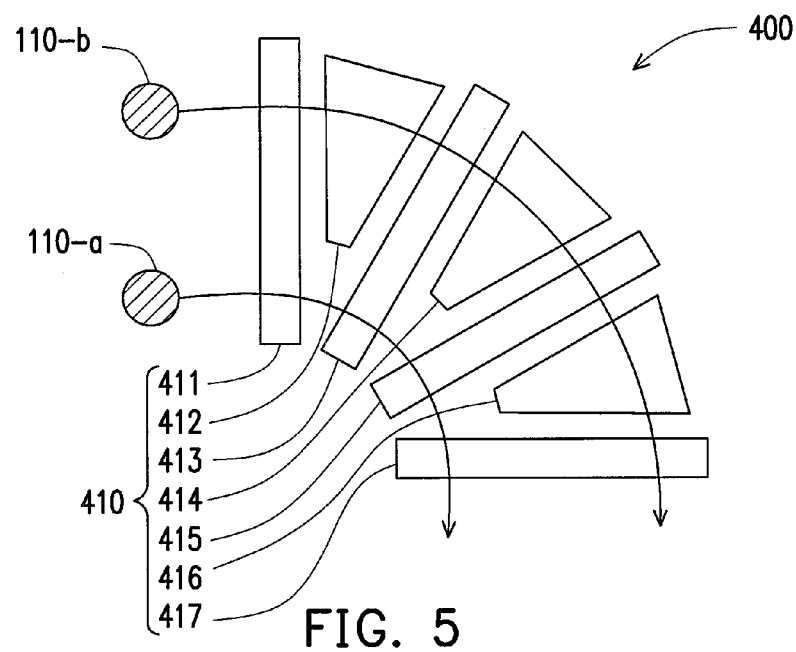
FIG. 5 is a top view of a layout of a particle transporter according to a second exemplary embodiment of the disclosure.

Implementation of the turn-around 400 is not limited to the above descriptions of FIG. 4. Those skilled in the art can implement the turn-around 400 by using other layout structures according to an actual design requirement. For example, FIG. 5 is a top view of a layout of a particle transporter according to a second exemplary embodiment of the disclosure. The related descriptions of FIG. 3 and FIG. 4 can be referred for descriptions of the exemplary embodiment of FIG. 5. Different to the exemplary embodiment of FIG. 4, the turn-around electrodes 412, 414 and 416 shown in FIG. 5 respectively have a trapezoidal shape.

Figure 6:
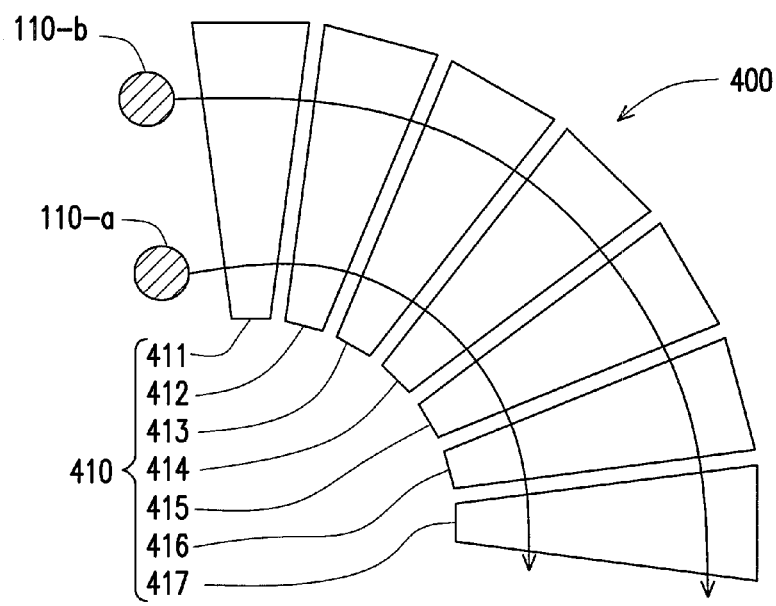
FIG. 6 is a top view of a layout of a particle transporter according to a third exemplary embodiment of the disclosure.

FIG. 6 is a top view of a layout of a particle transporter according to still a third exemplary embodiment of the disclosure. The related descriptions of FIG. 3 and FIG. 4 can be referred for descriptions of the exemplary embodiment of FIG. 6. Different to the exemplary embodiment of FIG. 4, the turn-around electrodes shown in FIG. 5 respectively have a trapezoidal shape. Those skilled in the art can change theses turn-around electrodes 410 to the triangular shapes or fan shapes according to an actual design requirement.

Figure 7:
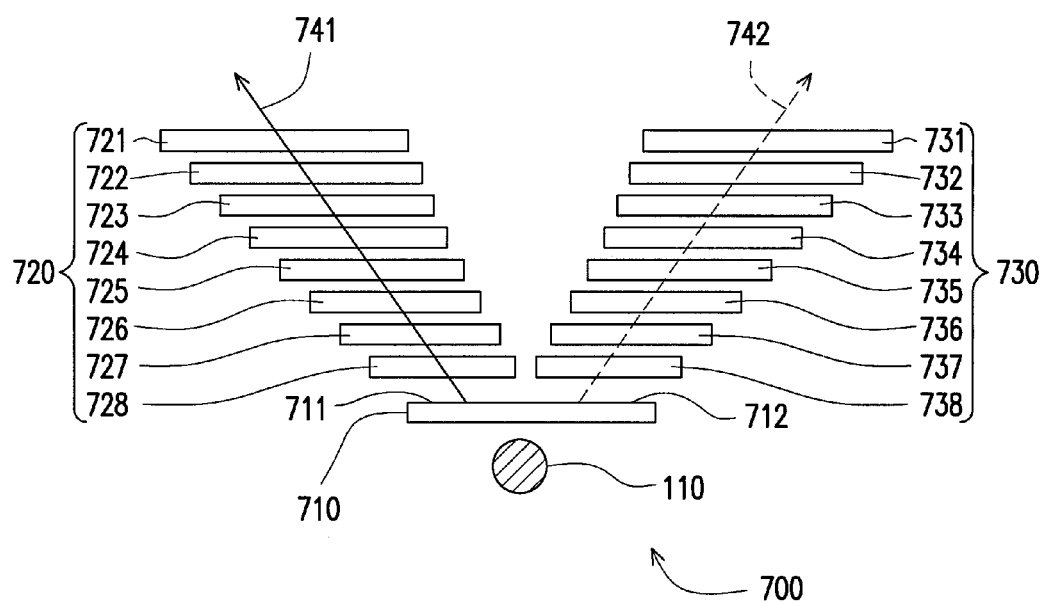
FIG. 7 is a top view of a layout of a particle transporter according to a fourth exemplary embodiment of the disclosure.

FIG. 7 is a top view of a layout of a particle transporter according to a fourth exemplary embodiment of the disclosure. The particle transporter includes a common electrode 710, a plurality of left switch electrodes 720 and a plurality of right switch electrodes 730 disposed on the substrate. The common electrode 710, the left switch electrodes 720 and the right switch electrodes 730 form a switch 700. For example, the left switch electrodes 720 include electrodes 721, 722, 723, 724, 725, 726, 727 and 728, and the right switch electrodes 730 include electrodes 731, 732, 733, 734, 735, 736, 737 and 738. In the present exemplary embodiment, the common electrode 710, the electrodes 721-728 and the electrodes 731-738 respectively have a rectangular shape, and if a width of each rectangular electrode is a, a space between any two electrodes of the rectangular electrodes is b, a and b satisfy an inequality of 0.5a<b<1.5a.

The left switch electrodes 720 and the right switch electrodes 730 are respectively disposed at a same side of the common electrode 710. The left switch electrodes 720 are disposed on the substrate along a first straight-line direction 741, and are disposed adjacent to a first end 711 at the same side of the common electrode 710, and the left switch electrodes 720 are parallel to the common electrode 710, as that shown in FIG. 7. The left switch electrodes 720 provide a left switch channel to transport the particles 110. The right switch electrodes 730 are disposed on the substrate along a second straight-line direction 742. The right switch electrodes 730 are disposed adjacent to a second end 712 at the same side of the common electrode 710, and are parallel to the common electrode 710, as shown in FIG. 7. The right switch electrodes 730 provide a right switch channel to transport the particles 110. Where, the first straight-line direction 741 extending from the first end 711 of the same side of the common electrode 710 does not intersect with the second straight-line direction 742 extending from the second end 712 of the same side of the common electrode 710, and a common end of the left switch channel and the right switch channel is formed at the common electrode 710.

The power supply unit provides power signals to the common electrode 710, the left switch electrodes 720 and the right switch electrodes 730 in the particle transporter. For example, if the particles 110 are about to be moved along the left switch channel (i.e. along the first straight-line direction 741), the left switch electrodes 720 and the common electrode 710 are respectively provided with a set of AC signals, and the right switch electrodes 730 are connected to the ground. The AC signals of any two adjacent electrodes of the left switch electrodes 720 and the common electrode 710 have a certain phase difference, which is, for example, 90°. Namely, in FIG. 7, if the AC signal provided to the common electrode 710 has a phase of 0°, the AC signal of the left switch electrode 728 then has a phase of 90°, the AC signal of the left switch electrode 727 has a phase of 180°, and the AC signal of the left switch electrode 726 has a phase of 270°. Deduced by analogy, the AC signals of the left switch electrodes 725, 724, 723, 722 and 721 respectively have phases of 0°, 90°, 180°, 270° and 0°. Therefore, the particles 110 can be moved along the first straight-line direction 741(along the direction shown by the arrow) through the left switch channel provided by these left switch electrodes 720.

If the particles 110 are about to be moved along the right switch channel (i.e. along the second straight-line direction 742), the right switch electrodes 730 and the common electrode 710 are respectively provided with a set of AC signals, and the left switch electrodes 720 are connected to the ground. The AC signals of any two adjacent electrodes of the right switch electrodes 730 and the common electrode 710 have a certain phase difference, which is, for example, 90°. Namely, if the AC signal provided to the common electrode 710 has a phase of 0°, the AC signal of the right switch electrode 738 then has a phase of 90°, the AC signal of the right switch electrode 737 has a phase of 180°, and the AC signal of the right switch electrode 736 has a phase of 270°. Deduced by analogy, the AC signals of the right switch electrodes 735, 734, 733, 732 and 731 respectively have phases of 0°, 90°, 180°, 270° and 0°. Therefore, the particles 110 can be moved along the second straight-line direction 742 (along the direction shown by the arrow) through the right switch channel provided by these right switch electrodes 730.

The switch 700 can also collect the particles of different sources to the common end of the left switch channel and the right switch channel, i.e. collect the particles to the common electrode 710. For example, if the AC signals of the electrodes 721 and 731 have the phase of 0°, the AC signals of the electrodes 722, 726, 732 and 736 have the phase of 90°, the AC signals of the electrodes 723, 727, 733 and 737 have the phase of 180°, the AC signals of the electrodes 724, 728, 734 and 738 have the phase of 270°, and the AC signals of the electrodes 725, 735 and 710 have the phase of 0°. In this way, the particles of different sources are respectively collected to the common electrode 710 through the left switch channel and the right switch channel.

Lengths of the left switch electrodes 720 and lengths of the corresponding right switch electrodes 730 can be the same. In the present exemplary embodiment, the lengths of the left switch electrodes 720 are different, and the lengths of the right switch electrodes 730 are different. For example, in FIG. 7, the lengths of the left switch electrodes 720 are sequentially decreased from the top to the bottom. Therefore, when the particles 110 pass through the left switch channel provided by the left switch electrodes 720 from the top to the bottom, the left switch electrodes 720 can simultaneously move and collect the particles 110 to the common electrode 710. Similarly, the lengths of the right switch electrodes 730 are sequentially decreased from the top to the bottom. Therefore, when the particles 110 pass through the right switch channel from the top to the bottom, the right switch electrodes 720 can simultaneously move and collect the particles 110 to the common electrode 710.

Those skilled in the art can arbitrarily combine the conveyer 200 of FIG. 2, the turn-around 400 of FIGS. 4-6 and/or the switch 700 of FIG. 7 according to an actual design requirement, so as to determine/define a moving path of the particles 110 in the particle transporter.

Figure 8:
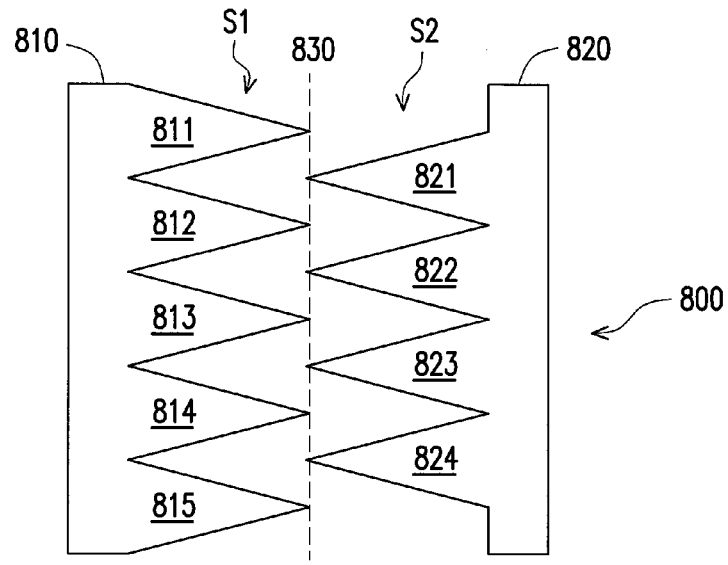
FIG. 8 is a top view of a layout of a particle transporter according to a fifth exemplary embodiment of the disclosure.

FIG. 8 is a top view of a layout of a particle transporter according to a fifth exemplary embodiment of the disclosure. The particle transporter includes a first collection electrode 810 and a second collection electrode 820 disposed on the substrate. The first collection electrode and the second collection electrode 820 form a collector 800. The first collection electrode 810 has a first dentate portion S1, and the first dentate portion S1 has a plurality of dentations, for example, dentations 811, 812, 813, 814 and 815. The second collection electrode 820 is disposed next to the first collection electrode 810, and located adjacent to the first dentate portion S1. The second collection electrode 820 has a second dentate portion S2 at a side adjacent to the first dentate portion S1. The second dentate portion S2 has a plurality of dentations, for example, dentations 821, 822, 823, 824. Where, a particle collection space is formed around tips of the dentate portions of the first collection electrode 810 and the second collection electrode 820.

The dentations 811-815 and 821-824 all have an acute angle or a right angle, and the dentations of the first dentate portion S1 and the dentations of the second dentate portion S2 are arranged on the substrate in a finger shape. Where, the tips of the dentations 811-815 and the tips of the dentations 821-824 are approximately aligned to a same straight line 830, as shown in FIG. 8. The tips of the dentations 811-815 and the tips of the dentations 821-824 can be arranged beyond the straight line 830 according to an actual design requirement, or the tips of the dentations 811-815 and the tips of the dentations 821-824 can be arranged without contacting the straight line 830 (or located away from the straight line 830).

The power supply unit provides the power signals to the first collection electrode 810 and the second collection electrode 820 of the particle transporter. For example, the first collection electrode 810 and the second collection electrode 820 are respectively provided with an AC signal, and the AC signals of the first collection electrode 810 and the second collection electrode 820 have a certain phase difference, which is, for example, 180°. Namely, if the AC signal provided to the first collection electrode 810 has a phase of 0°, the AC signal of the second collection electrode 820 then has a phase of 180°. Therefore, the particle collection space is formed between the first collection electrode 810 and the second collection electrode 820. The particles 110 are maintained around the tips of the dentate portions in the particle collection space.

Figure 9:
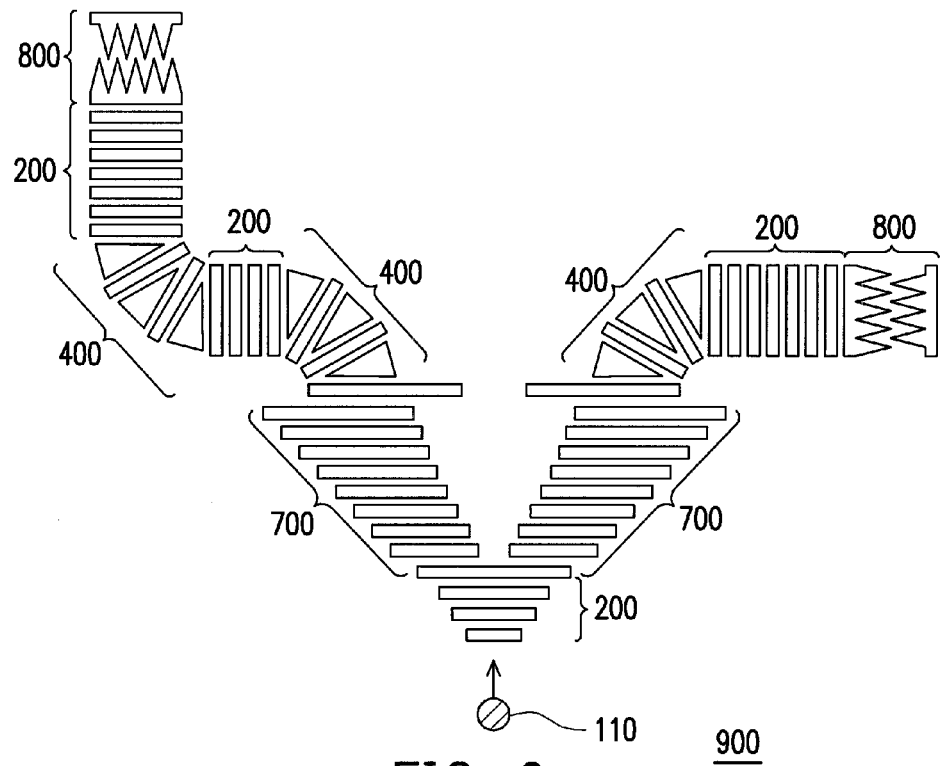
FIG. 9 is a top view of a layout of a particle transporter according to a sixth exemplary embodiment of the disclosure.

Those skilled in the art can arbitrarily combine the conveyer 200 of FIG. 2, the turn-around 400 of FIGS. 4-6, the switch 700 of FIG. 7 and/or the collector 800 of FIG. 8 according to an actual design requirement, so as to determine/define a moving path of the particles 110 in the particle transporter. For example, FIG. 9 is a top view of a layout of a particle transporter 900 according to a sixth exemplary embodiment of the disclosure. The particle transporter 900 includes four conveyers 200, three turn-around 400, one switch 700 and two collectors 800. Related descriptions of FIG. 2, FIG. 4, FIG. 7 and FIG. 8 can be referred for implementations of the conveyer 200, the turn-around 400, the switch 700 and the collector 800, and detailed descriptions thereof are not repeated.

If the particles 110 are about to be moved from the bottom of FIG. 9 to the top-left collector 800, the left switch electrodes 720 of the switch 700 and all of the electrodes at the left part of FIG. 9 are respectively provided with a set of AC signals of properly designed phases, and the right switch electrodes 730 of the switch 700 and all of the electrodes at the right part of FIG. 9 are connected to the ground. Therefore, the particles 110 can move from the conveyer 200 at the bottom of FIG. 9 to the top-left collector 800 through the switch 700, the turn-around 400, the conveyer 200, the turn-around 400 and the conveyer 200.

If the particles 110 are about to be moved from the bottom of FIG. 9 to the top-right collector 800, the right switch electrodes 730 of the switch 700 and all of the electrodes at the right part of FIG. 9 are respectively provided with a set of AC signals of properly designed phases, and the left switch electrodes 720 of the switch 700 and all of the electrodes at the left part of FIG. 9 are maintained floating (or connected to the ground). Therefore, the particles 110 can move from the conveyer 200 at the bottom of FIG. 9 to the top-right collector 800 through the switch 700, the turn-around 400 and the conveyer 200.

In summary, in the particle transporter 900 of the above exemplary embodiment, the AC electric field generated by a plurality of the electrodes on the substrate is used to produce the DEP force and the twDEP force to transport or collect the particles 110. Therefore, the particle transporter 900 can be used to transport the particles 110 in a static fluid (for example, solution). Since the neighbouring sides of any two adjacent electrodes of the turn-around electrodes in the turn-around 400 are approximately parallel, the particles 110 at any positions in the arc channel formed by the turn-around electrodes can be smoothly turned around without escaping. The particle transporters disclosed by the aforementioned exemplary embodiments can be arbitrarily combined with the four basic modules (the conveyer 200, the turn-around 400, the switch 700 and the collector 800) to implement various transmissions. The combined particle transporter can transport the particles 110 along desired transmission paths or fix the particles 110 under a static fluid environment without using other devices to drive the fluid. The particle transporters of the aforementioned exemplary embodiments can be applied in biomedical and chemical researches or industries.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A particle transporter, comprising:
a power supply unit, for providing power signals to electrodes in the particle transporter; and
a plurality of turn-around electrodes, disposed on a substrate, and arranged in a fan shape to provide an arc channel for transporting a plurality of particles, wherein the turn-around electrodes are not connected to each other, and neighbouring sides of any two adjacent turn-around electrodes in the turn-around electrodes are approximately parallel, wherein the turn-around electrodes comprise:
a first turn-around electrode, having a rectangular shape;

a second turn-around electrode, having a rectangular shape, wherein the first turn-around electrode and the second turn-around electrode are arranged on the substrate in a fan shape; and a third turn-around electrode, having a trapezoidal shape, a triangular shape or a fan shape, and disposed between the first turn-around electrode and the second turn-around electrode, wherein neighbouring sides of the first turn-around electrode and the third turn-around electrode are parallel to each other, and neighbouring sides of the second turn-around electrode and the third turn-around electrode are parallel to each other.

2. The particle transporter as claimed in claim 1, wherein the power signals are alternating-current (AC) signals, and the AC signals of any two adjacent turn-around electrodes in the turn-around electrodes have a phase difference.

3. The particle transporter as claimed in claim 2, wherein the phase difference is 90 degrees.

4. The particle transporter as claimed in claim 1, wherein a width of the first turn-around electrode is a, and a space between the first turn-around electrode and the third turn-around electrode is b, then $0.5a<b<1.5a$.

5. The particle transporter as claimed in claim 1, wherein when the third turn-around electrode has a triangular shape or a fan shape, a width of the first turn-around electrode is a, and a length of a side opposite to an acute angle of the third turn-around electrode is c, then $c \leq 2a$.

6. The particle transporter as claimed in claim 1, wherein the turn-around electrodes respectively have one of a trapezoidal shape, a triangular shape, a rectangular shape or a fan shape.

7. The particle transporter as claimed in claim 1, further comprising:

a common electrode, disposed on the substrate;

a plurality of left switch electrodes, disposed on the substrate along a first straight-line direction, and disposed adjacent to a first end at one side of the common electrode, wherein the left switch electrodes are parallel to the common electrode, and provide a left switch channel for transporting the particles; and a plurality of right switch electrodes, disposed on the substrate along a second straight-line direction, and disposed adjacent to a second end at the side of the common electrode, wherein the right switch electrodes are parallel to the common electrode, and provide a right switch channel for transporting the particles wherein a common end of the left switch channel and the right switch channel is formed at the common electrode.

8. The particle transporter as claimed in claim 7, wherein the common electrode, the left switch electrodes and the right switch electrodes respectively have a rectangular shape, wherein a width of any electrode of the left switch electrodes and the right switch electrodes is a, and a space between any two adjacent electrodes in the left switch electrodes and the right switch electrodes is b, then $0.5a<b<1.5a$.

9. The particle transporter as claimed in claim 7, wherein lengths of the left switch electrodes are different, and lengths of the right switch electrodes are different.

10. The particle transporter as claimed in claim 7, wherein the first straight-line direction extending from the first end of the side of the common electrode does not intersect with the second straight-line direction extending from the second end of the side of the common electrode.

11. The particle transporter as claimed in claim 7, wherein the power signals are AC signals, the AC signals of any two adjacent electrodes in the left switch electrodes have a first phase difference, and the AC signals of any two adjacent electrodes in the right switch electrodes have a second phase difference.

12. The particle transporter as claimed in claim 11, wherein the first phase difference and the second phase difference are 90 degrees.

13. The particle transporter as claimed in claim 1, further comprising:

a first collection electrode, disposed on the substrate, and having a first dentate portion; and a second collection electrode, disposed on the substrate and located adjacent to the first dentate portion of the first collection electrode, and having a second dentate portion at a side adjacent to the first dentate portion, wherein a particle collection space is formed around tips of the first dentate portion and the second dentate portion.

14. The particle transporter as claimed in claim 13, wherein any dentation of the first dentate portion and the second dentate portion has an acute angle or a right angle.

15. The particle transporter as claimed in claim 13, wherein a tip of any dentation of the first dentate portion and the second dentate portion is approximately aligned to a same straight line.

16. The particle transporter as claimed in claim 13, wherein dentations of the first dentate portion and the second dentate portion are arranged in a finger shape.

17. The particle transporter as claimed in claim 13, wherein the power signals are AC signals, and the AC signals of the first collection electrode and the second collection electrode have a phase difference.

18. The particle transporter as claimed in claim 17, wherein the phase difference is 180 degrees.

19. The particle transporter as claimed in claim 1, further comprising:

a plurality of transport electrodes, disposed on the substrate along a straight-line direction, wherein the transport electrodes are parallel to each other and provide a straight-line channel for transporting the particles.

20. The particle transporter as claimed in claim 19, wherein the transport electrodes respectively have a rectangular shape, wherein a width of each of the transport electrodes is a, and a space between any two adjacent electrodes of the transport electrodes is b, then $0.5a<b<1.5a$.

21. The particle transporter as claimed in claim 19, wherein lengths of the transport electrodes are approximately the same.

22. The particle transporter as claimed in claim 19, wherein the power signals are AC signals, and the AC signals of any two adjacent electrodes of the transport electrodes have a phase difference.

23. The particle transporter as claimed in claim 22, wherein the phase difference is 90 degrees.

24. The particle transporter as claimed in claim 1, wherein the substrate is a printed circuit board (PCB).

* * * * *